(12) United States Patent
Jhu et al.

(10) Patent No.: US 8,305,747 B2
(45) Date of Patent: Nov. 6, 2012

(54) ROTARY HINGE AND A PORTABLE ELECTRONIC DEVICE WITH THE SAME

(75) Inventors: Ruei-Lin Jhu, Shulin (TW); Weiming Chen, Shulin (TW)

(73) Assignee: Shin Zu Shing Co., Ltd., Taipei Hsien (TW)

( * ) Notice: Subject to any disclaimer, the term of this patent is extended or adjusted under 35 U.S.C. 154(b) by 386 days.

(21) Appl. No.: 12/684,212

(22) Filed: Jan. 8, 2010

(65) Prior Publication Data

US 2011/0170240 A1 Jul. 14, 2011

(51) Int. Cl.
G06G 1/16 (2006.01)

(52) U.S. Cl. ........... 361/679.3; 361/679.55; 361/679.56; 455/575.1; 455/575.4; 379/428.01; 379/428.03

(58) Field of Classification Search ................. 361/679.3
See application file for complete search history.

(56) References Cited

U.S. PATENT DOCUMENTS

| 7,092,246 B2 | 8/2006 | Tanaka et al. | |
|---|---|---|---|
| 7,319,892 B2 | 1/2008 | Kato | |
| 7,419,099 B2* | 9/2008 | Lee et al. | 235/472.01 |
| 7,567,830 B2* | 7/2009 | Hur | 455/575.4 |
| 7,685,680 B2* | 3/2010 | Chien et al. | 16/361 |
| 7,735,197 B2* | 6/2010 | Chien | 16/337 |
| 7,865,151 B2* | 1/2011 | Cho | 455/90.3 |
| 8,122,568 B2* | 2/2012 | Jin et al. | 16/357 |
| 8,155,718 B2* | 4/2012 | Byun et al. | 455/575.4 |
| 2005/0107137 A1* | 5/2005 | Byun et al. | 455/575.1 |
| 2006/0025184 A1* | 2/2006 | Cho et al. | 455/575.4 |
| 2006/0223596 A1* | 10/2006 | Hur | 455/575.4 |
| 2007/0171195 A1 | 7/2007 | Kim et al. | |
| 2008/0051162 A1 | 2/2008 | Kim et al. | |
| 2008/0120806 A1 | 5/2008 | Liu | |
| 2008/0125201 A1* | 5/2008 | Kim et al. | 455/575.4 |
| 2008/0176607 A1 | 7/2008 | Jin et al. | |
| 2008/0232048 A1 | 9/2008 | Yamamoto et al. | |
| 2010/0137041 A1* | 6/2010 | Lee | 455/575.4 |

FOREIGN PATENT DOCUMENTS

| TW | M332346 | 5/2008 |
|---|---|---|
| TW | M333484 | 6/2008 |

* cited by examiner

*Primary Examiner* — Anthony Q Edwards
(74) *Attorney, Agent, or Firm* — Rabin & Berdo, P.C.

(57) ABSTRACT

A rotary hinge for an electronic device with a cover and a body is mounted between a bottom of the cover and a top of the body and has a receiving assembly, a connecting assembly and a retaining assembly. The receiving assembly is connected to the cover. The connecting assembly is connected to the body and is attached pivotally to the receiving assembly. The retaining assembly is connected respectively to the receiving and connecting assemblies to selectively hold the cover at closed and open positions. With only one pivot between the rotary hinge and the cover, part of the body is exposed to allow the input unit being used when the cover is pivoted to open. Regardless of opening or closing the cover, the rotary hinge is hidden to prevent from damaging and foreign matters.

9 Claims, 23 Drawing Sheets

ROTARY HINGE AND A PORTABLE ELECTRONIC DEVICE WITH THE SAME

BACKGROUND OF THE INVENTION

1. Field of the Invention

The present invention relates to a rotary hinge, especially to a rotary hinge mounted between a cover and a body of a portable electronic device to allow the cover pivoting relative to the body.

2. Description of the Prior Arts

Portable electronic devices with a cover and a body, such as mobile phones, digital cameras, have different structures to arrange the relative position of the cover and the body. A conventional portable electronic device has a sliding mechanism, such as those disclosed in U.S. Pat. Nos. 7,319,892, 7,092,246, in U.S. Patent Application Publications 2008/0120806, 2007/0171195, 2008/0176607, 2008/0232048, 2008/0051162, 2008/0125201, and in Taiwan Patents M332346 and M333484, each of which is incorporated herein by reference. The bottom of the cover is attached slidably to the top of the body via the sliding mechanism. When the cover aligns with the body, the conventional portable electronic is closed. Then the user may watch the screen on the cover or use the touch panel on the cover. When the cover is rotated to misalign with the body, the conventional portable electronic device is opened. Then the input unit of the body is revealed so that the user may enter commands via the input unit.

However, the conventional portable electronic device with the sliding mechanism has following disadvantages:

1. The channels may be revealed when the conventional portable electronic device is opened. Dust and foreign matters easily fall into the revealed channels to block the channels so that the slide between the cover and the body is retarded. Moreover, because the channels are long and narrow, the dust and foreign matters are not easily cleaned.

2. In some conventional portable electronic devices, the sliding mechanism allows the cover to slide and rotate relative to the body with more than two channels. Generally, the central lines of the cover and the body should remain to align with each other for easily used no matter opened or closed. The channels need to be precisely arranged to cause the central lines of the cover and the body to remain to align with each other when opened. To precisely arrange the channels complicates the manufacturing process of the conventional portable electronic device.

To overcome the shortcomings, the present invention provides a rotary hinge to mitigate or obviate the aforementioned problems.

SUMMARY OF THE INVENTION

The main objective of the present invention is to provide a rotary hinge for an electronic device with a cover and a body, which remains hidden when the cover is opened. The rotary hinge is mounted between a bottom of the cover and a top of the body and has a receiving assembly, a connecting assembly and a retaining assembly. The receiving assembly is connected to the cover. The connecting assembly is connected to the body and is attached pivotally to the receiving assembly. The retaining assembly is connected respectively to the receiving and connecting assemblies to selectively hold the cover at closed and open positions. With only one pivot between the rotary hinge and the cover, part of the body is exposed to allow the input unit being used when the cover is pivoted to open. Regardless of opening or closing the cover, the rotary hinge is hidden to prevent from damaging and foreign matters.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
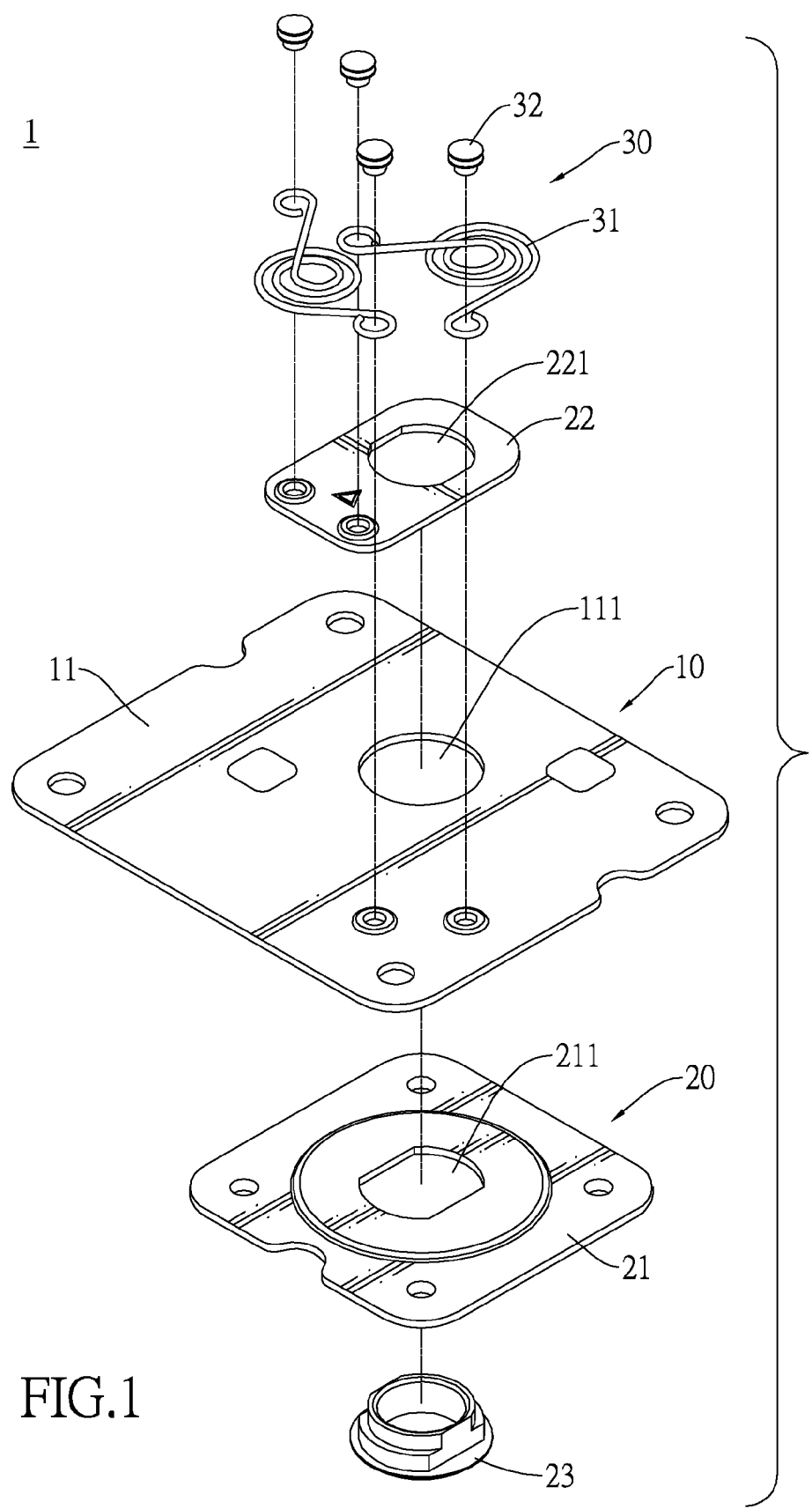
FIG. 1 is an exploded perspective view of a rotary hinge in accordance with the present invention.

With reference to FIG. 1, a rotary hinge in accordance with the present invention comprises a receiving assembly (10), a connecting assembly (20) and a retaining assembly (30).

The receiving assembly (10) has a receiving panel (11) with a first pivoting hole (111) formed therethrough.

The connecting assembly (20) is connected pivotally to the receiving assembly (10) and comprises a connecting panel (21), an additional panel (22) and a pintle (23). The connecting and additional panels (21, 22) are attached respectively to two opposite sides of the receiving panel (11). The connecting panel (21) has a second pivoting hole (211) formed therethrough. The additional panel (22) has third pivoting hole (221) formed therethrough. The pivoting holes (111, 211, 221) align with each other. The pintle (23) is mounted securely through the connecting panel (21) and the additional panel (22) and is mounted rotatably through the receiving panel (11) to connect the connecting and additional panels (21, 22) pivotally to the receiving panel (11). The pintle (23) may be mounted through the second pivoting hole (211), the first pivoting hole (111) and the third pivoting hole (221) in sequence. In a preferred embodiment, the first pivoting hole (111) is circular, the second and third pivoting holes (211, 221) are non-circular and the pintle (23) is non-circular in cross section. Therefore, the pintle (23) is keyed into the second and third pivoting holes (211, 221).

The retaining assembly (30) is connected to the receiving assembly (10) and the connecting assembly (20) and provides resilient force to selectively hold the receiving assembly (10) and the connecting assembly (20) at two relative positions. The retaining assembly (30) has at least one torsion spring (31). The size, the weight, or the required resilient force of the devices with the rotary hinge (1) as described determines the number of the torsion spring (31). Each torsion spring (31) has one end connected to the receiving panel (11) and the other end connected to the additional panel (22). Pins (32) may be individually mounted through the ends of the torsion spring (31) to connect the panels (11, 22). When the receiving assembly (10) and the connecting assembly (20) are pivoted relative to each other, the torsion spring (31) provides resilient force to position the receiving panel (11) and the connecting panel (21).

Figure 2:
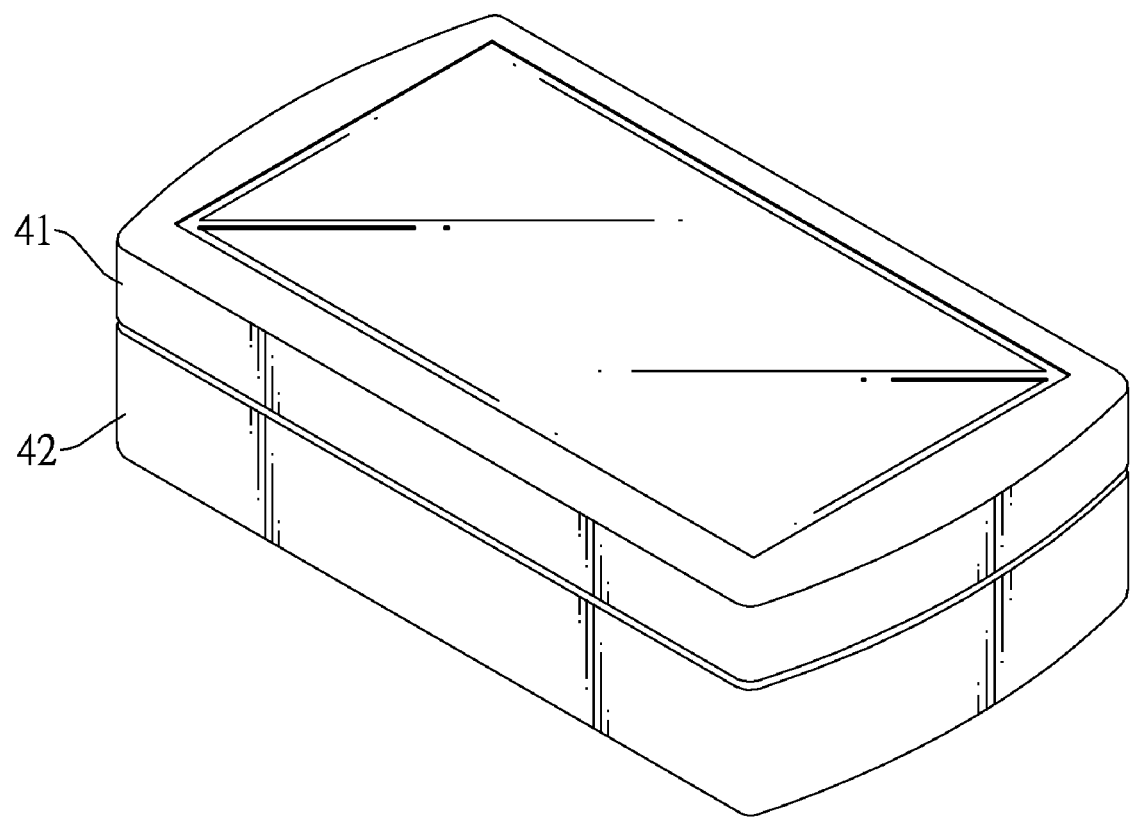
FIG. 2 is a perspective view of a portable electronic device in accordance with the present invention with the rotary hinge in FIG. 1.
Figure 3:
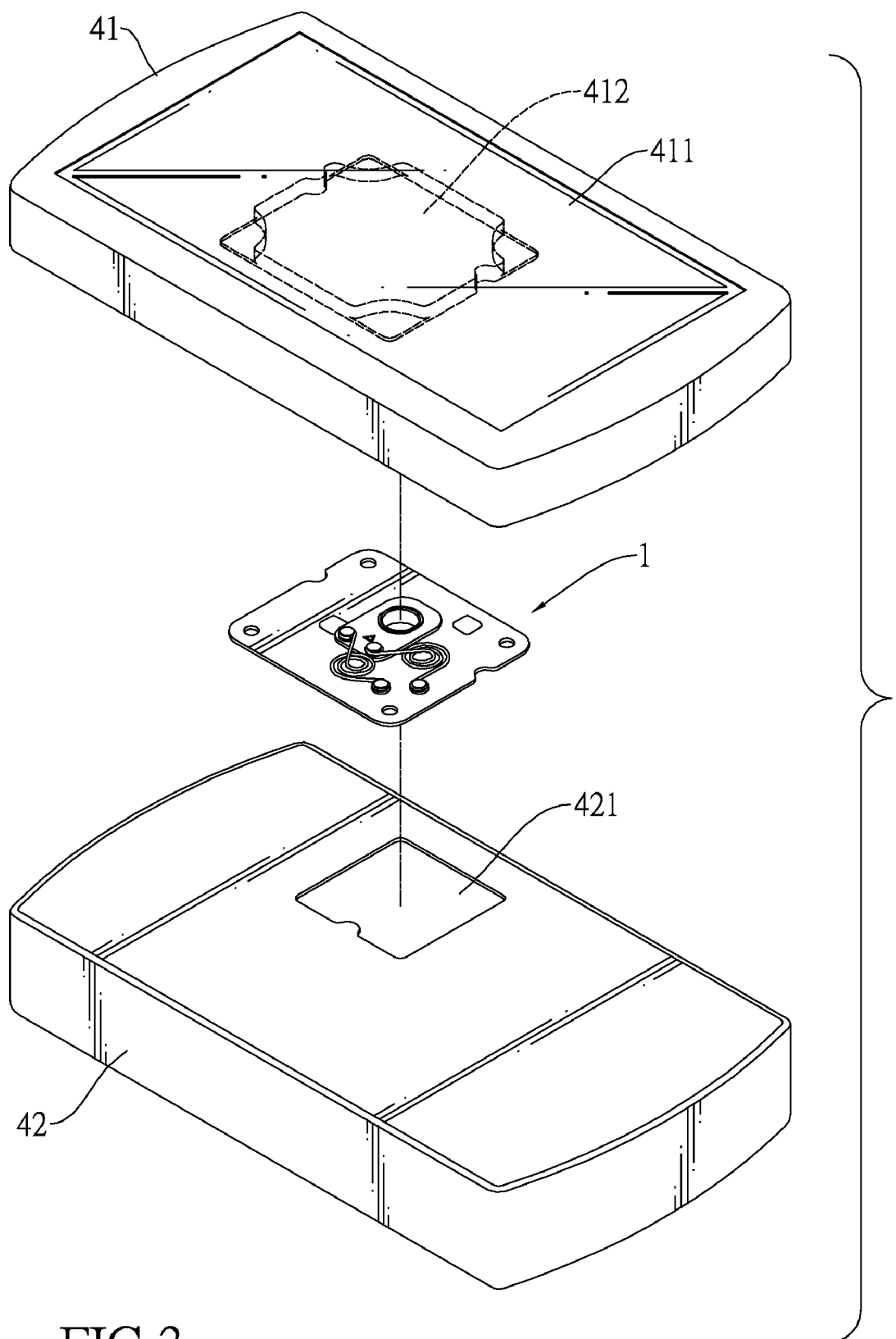
FIG. 3 is an exploded perspective view of the portable electronic device in FIG. 2.

With reference to FIGS. 2 and 3, a portable electronic device (40) in accordance with the present invention comprises a cover (41), a body (42) and a rotary hinge (1) as described. A screen (411) is mounted on a top of the cover (41). The rotary hinge (1) is mounted between the bottom of the cover (41) and the top of the body (42). The rotary hinge (1) is attached to a middle portion of the bottom of the cover (41). The receiving assembly (10) is attached to the cover (41). The connecting assembly (20) is attached to the body (42). In a preferred embodiment, the receiving panel (11) is mounted securely in a first mounting recess (412) in the bottom of the cover (41). The additional panel (22) and the torsion spring (31) are located in the first mounting recess (412) in the bottom of the cover (41). The connecting panel (21) is mounted securely in a second mounting recess (421) in the top of the body (42).

Figure 4:
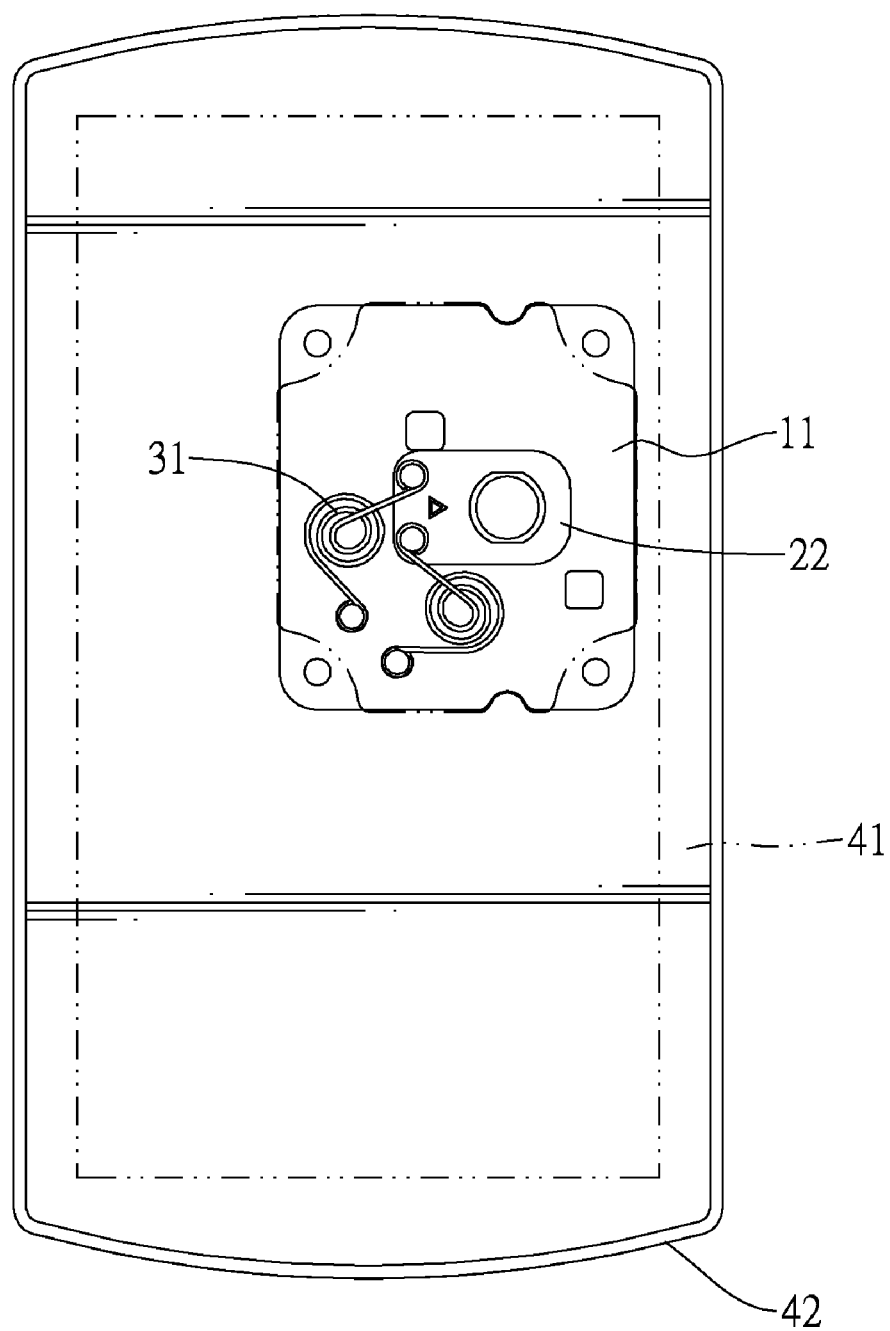
FIG. 4 is an operational top view of the portable electronic device in FIG. 2, shown closed.

With further reference to FIG. 4, the cover (41) and the body (42) have the same cross-sectional area. When the portable electronic device (40) is closed, the cover (41) aligns with the body (42) and the torsion spring (31) forces the cover (41) and the body (42) to stay at closed position.

Figure 5:
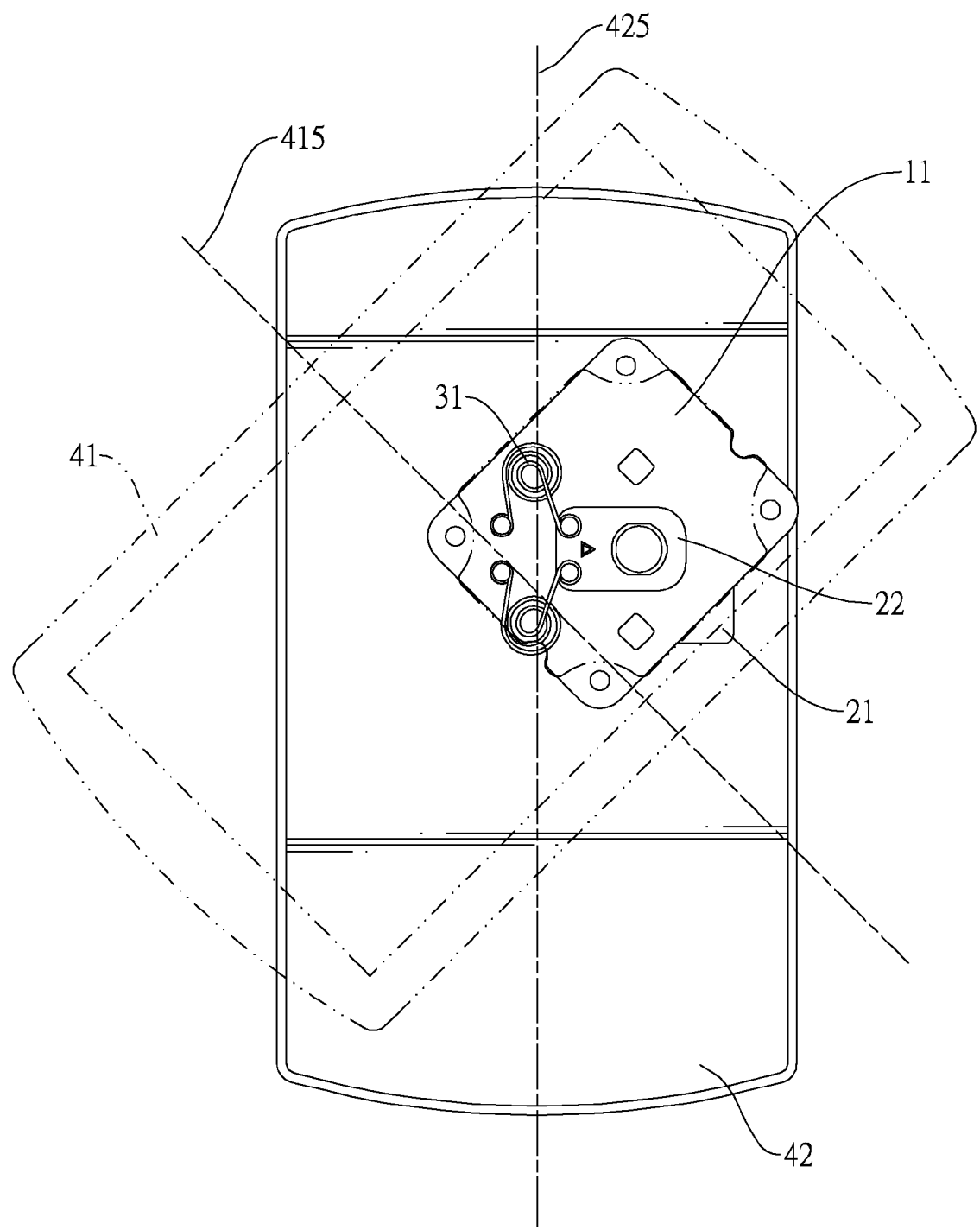
FIG. 5 is an operational top view of the portable electronic device in FIG. 2, shown partially opened.

With further reference to FIG. 5, the cover (41) is pivoted relative to the body (42). The receiving panel (11) is rotated relative to the connecting assembly (20) and the torsion spring (31) is compressed.

Figure 6:
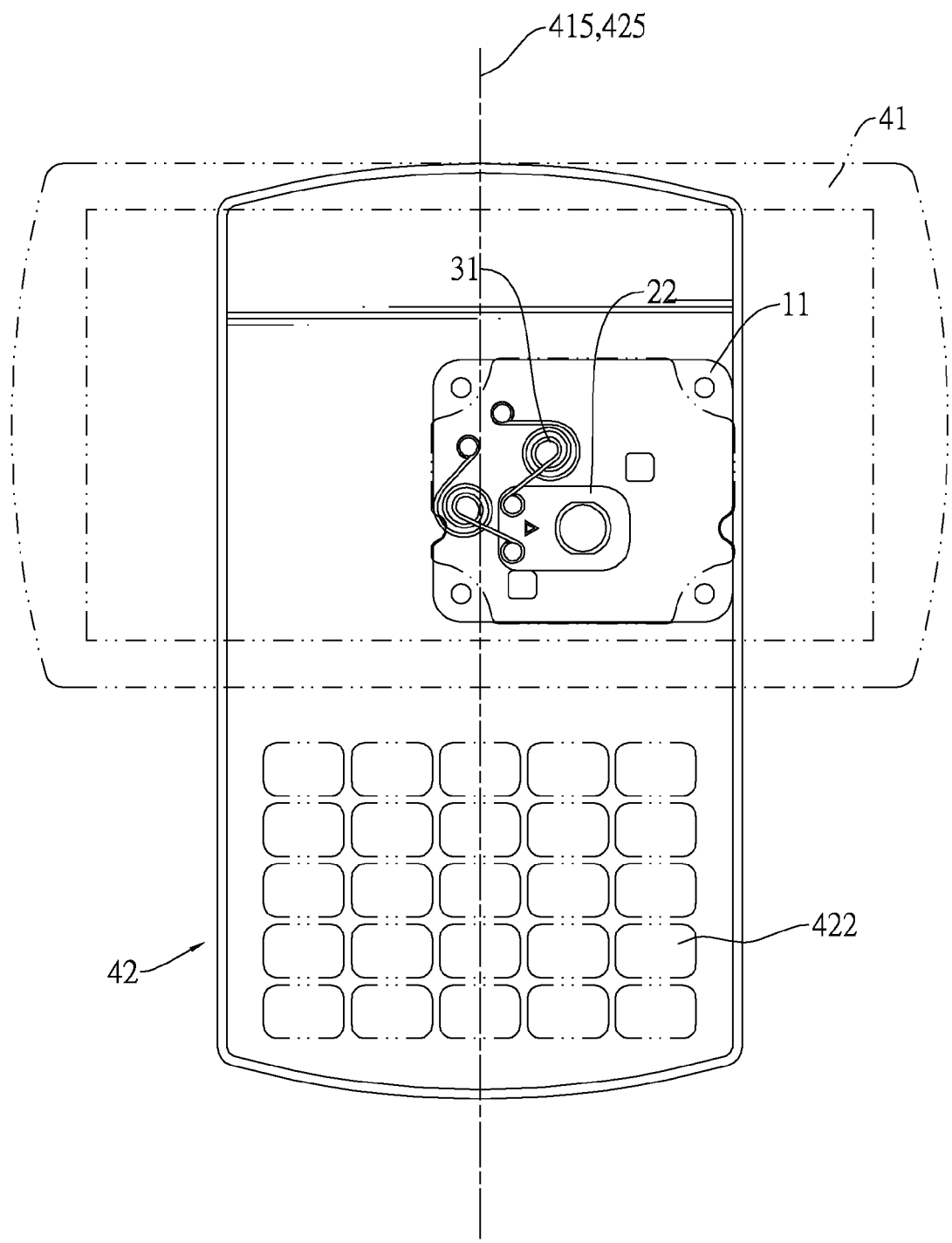
FIG. 6 is an operational top view of the portable electronic device in FIG. 2, shown fully opened.

With further reference to FIG. 6, when the cover (41) is pivoted to a certain distance, the cover (41) may be released and the torsion spring (31) pushes the cover (41) to keep pivoting until fully opened. Then the torsion spring (31) holds the cover (41) at a fully opened position. The cover (41) rotates 90 degrees when fully opened and a central line (415) of the cover (41) aligns with a central line (425) of the body (42). An input unit (422) on the body (42), such as keyboard, is revealed for the user to enter commands.

Figure 7:
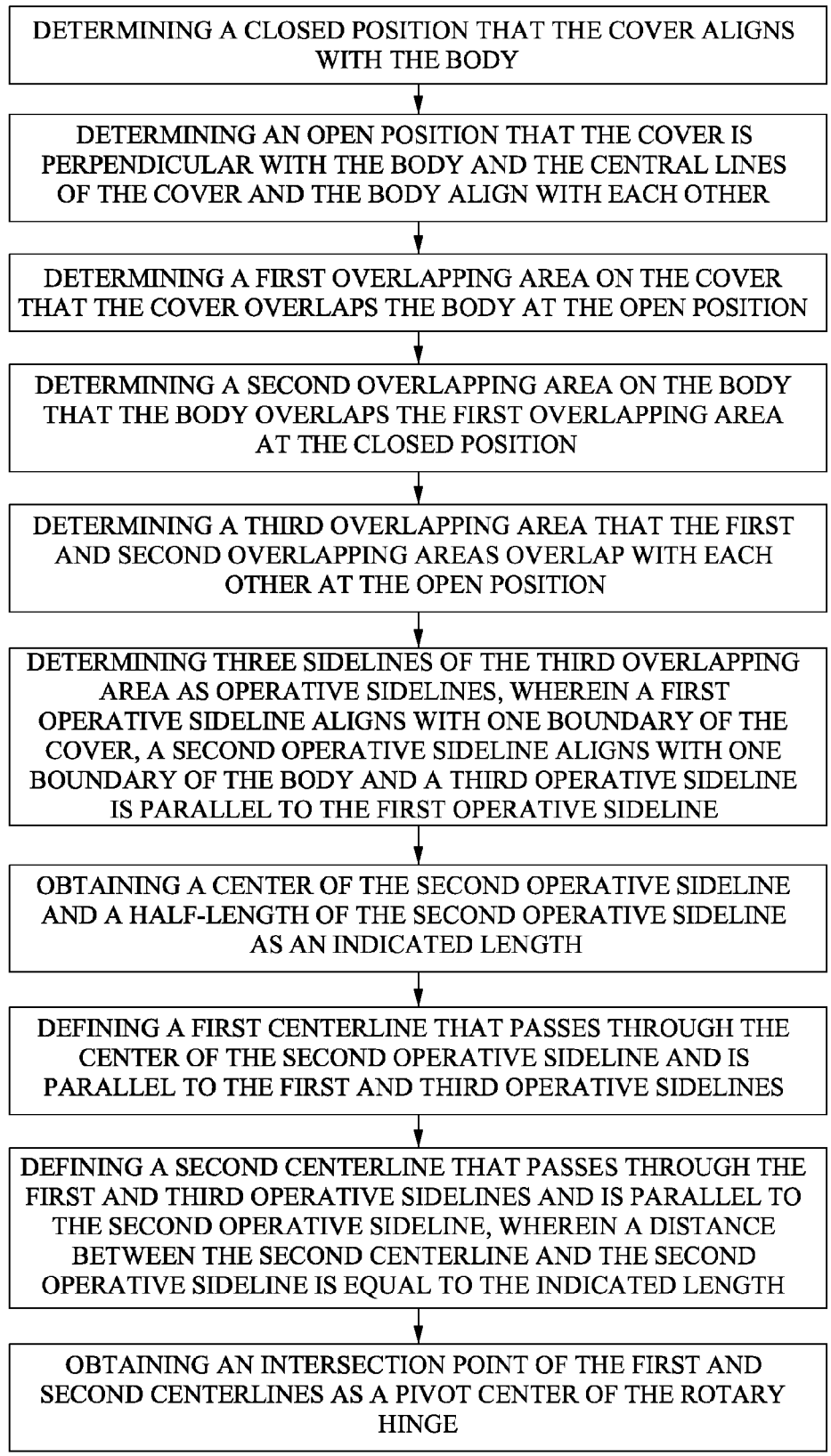
FIG. 7 is a block diagram of a method of determining a pivot for a rotary hinge of a portable electronic device in accordance with the present invention.

To precisely assemble the portable electronic device (40) so that the central line (415) of the cover (41) aligns with the central line (425) of the body (42) when the cover (41) is pivoted 90 degrees, the method of finding a pivot for the rotary hinge (1) in accordance with the present invention comprises the following steps as shown in FIG. 7.

The method disclosed herein can be applied to any different sizes of the cover (41) and the body (42). FIGS. 8A to 8E show that the cover (41) and the body (42) are with the same size while FIGS. 9A to 9E illustrate that the cover (41A) and the body (42) are with different sizes.

Figure 8A:
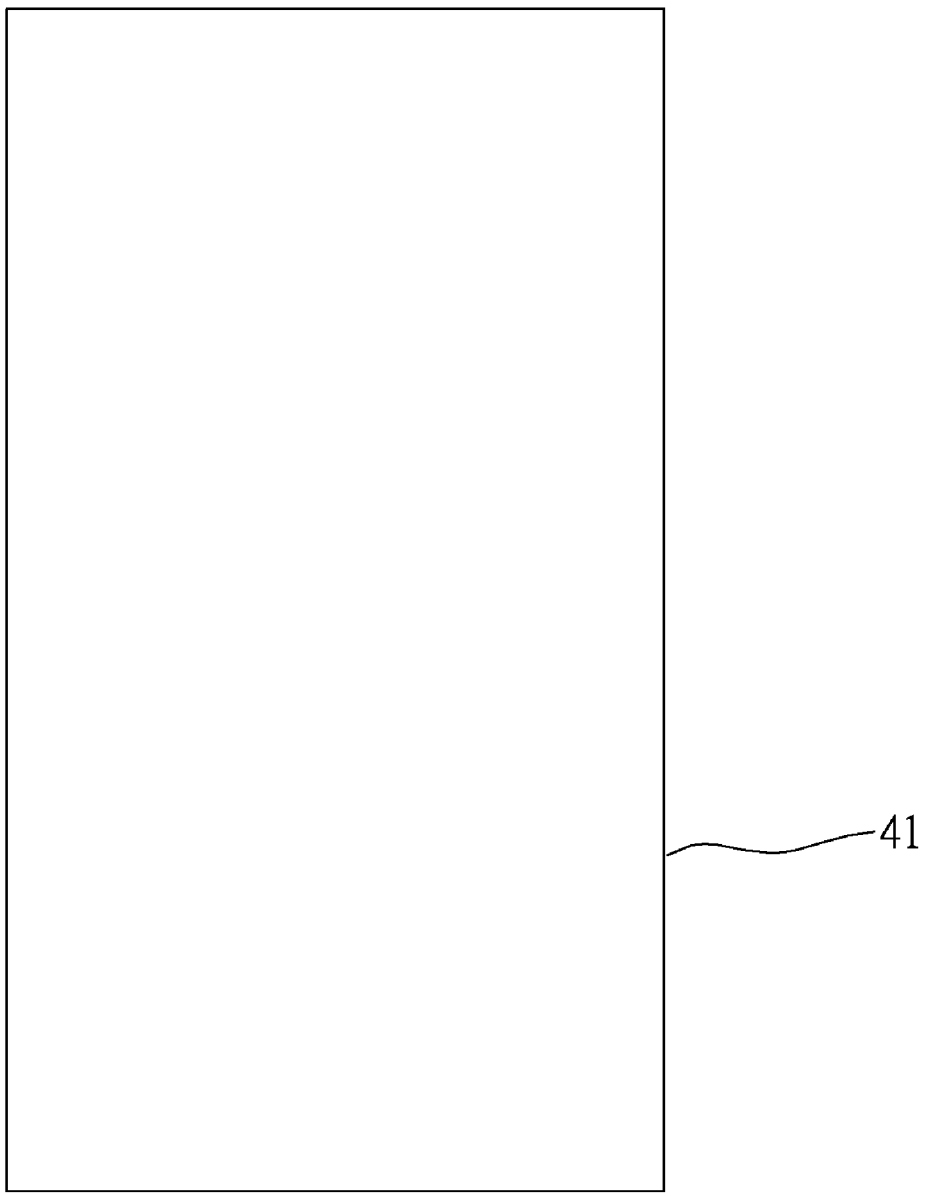
FIGS. 8A to 8E are illustrating views of the method in FIG. 7.
Figure 9A:
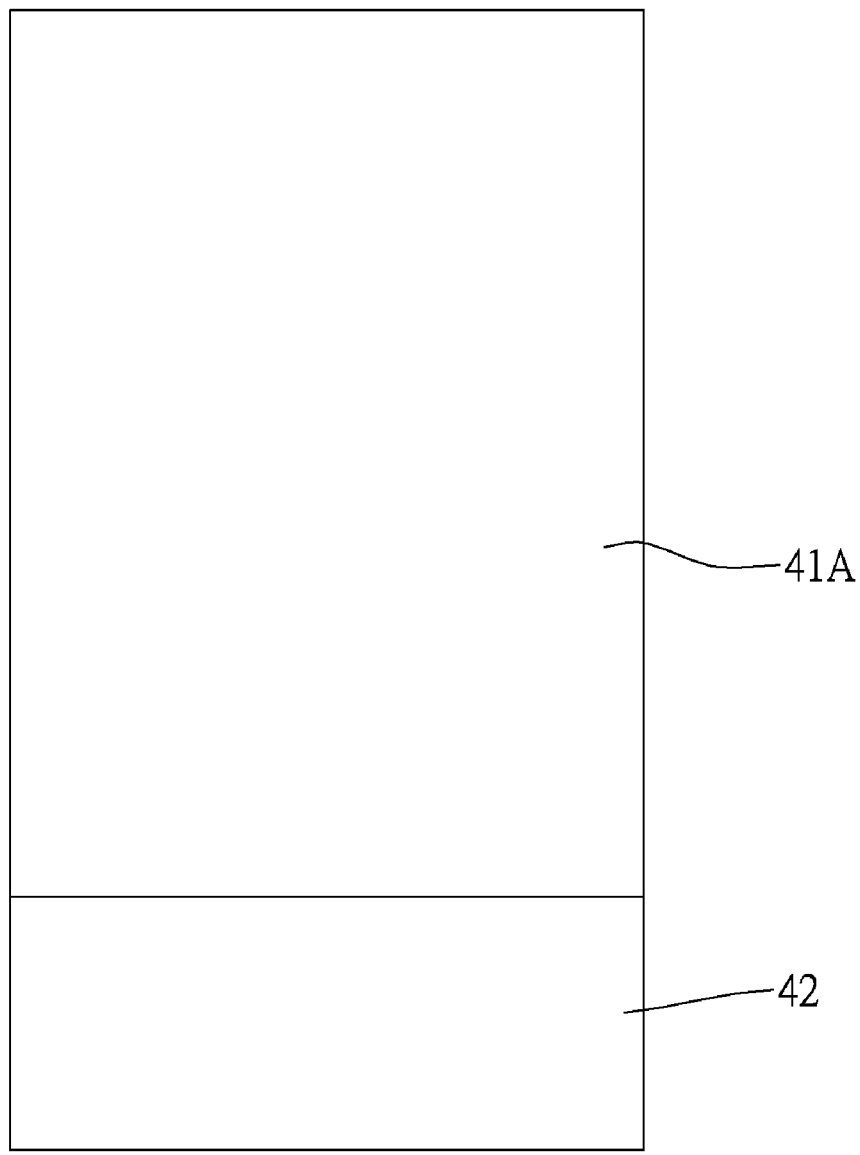
FIGS. 9A to 9E are other illustrating views of the method in FIG. 7.

With further reference to FIGS. 8A and 9A, determine a closed position that the cover (41, 41A) aligns with the body (42).

Figure 8B:
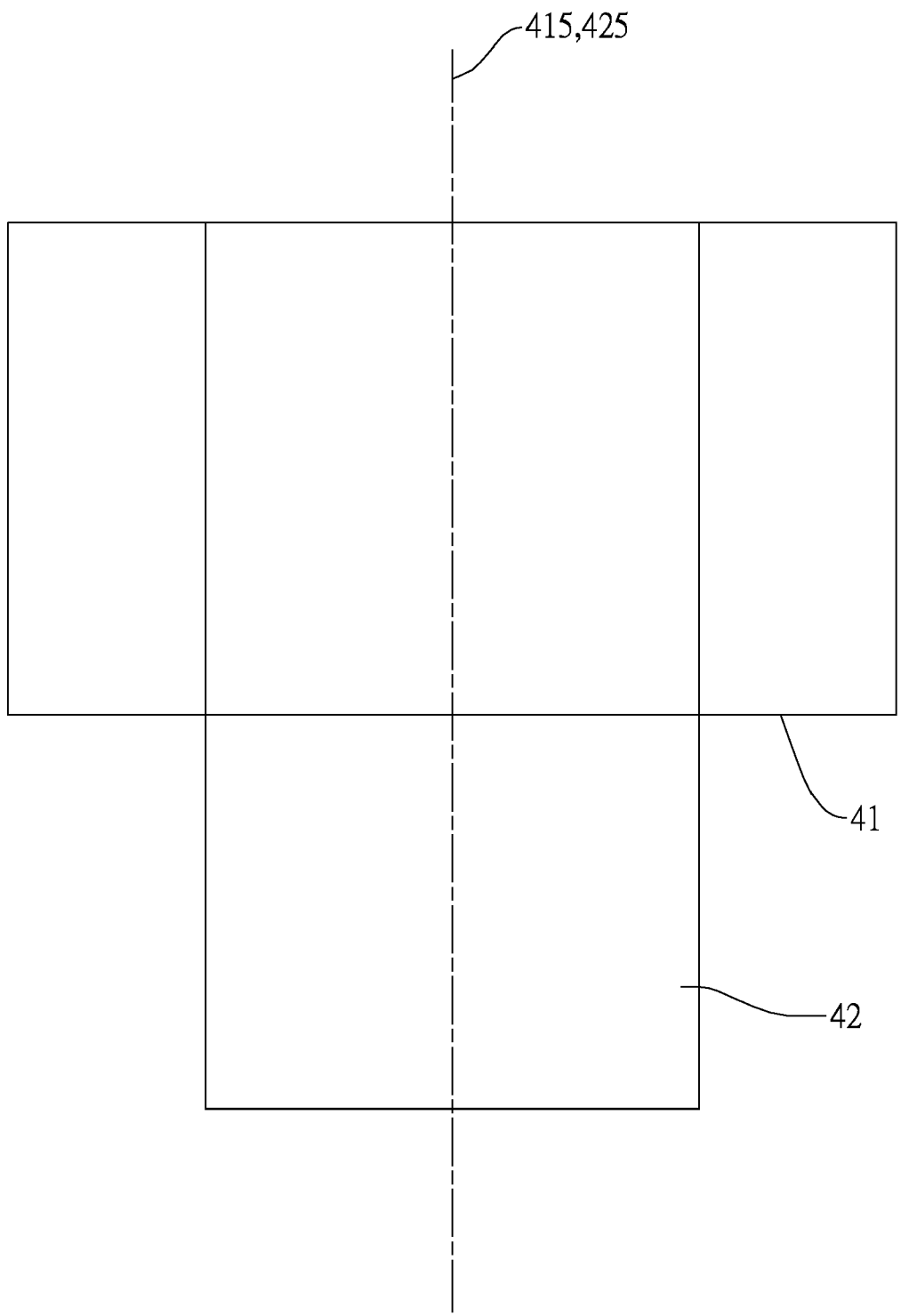
Figure 9B:
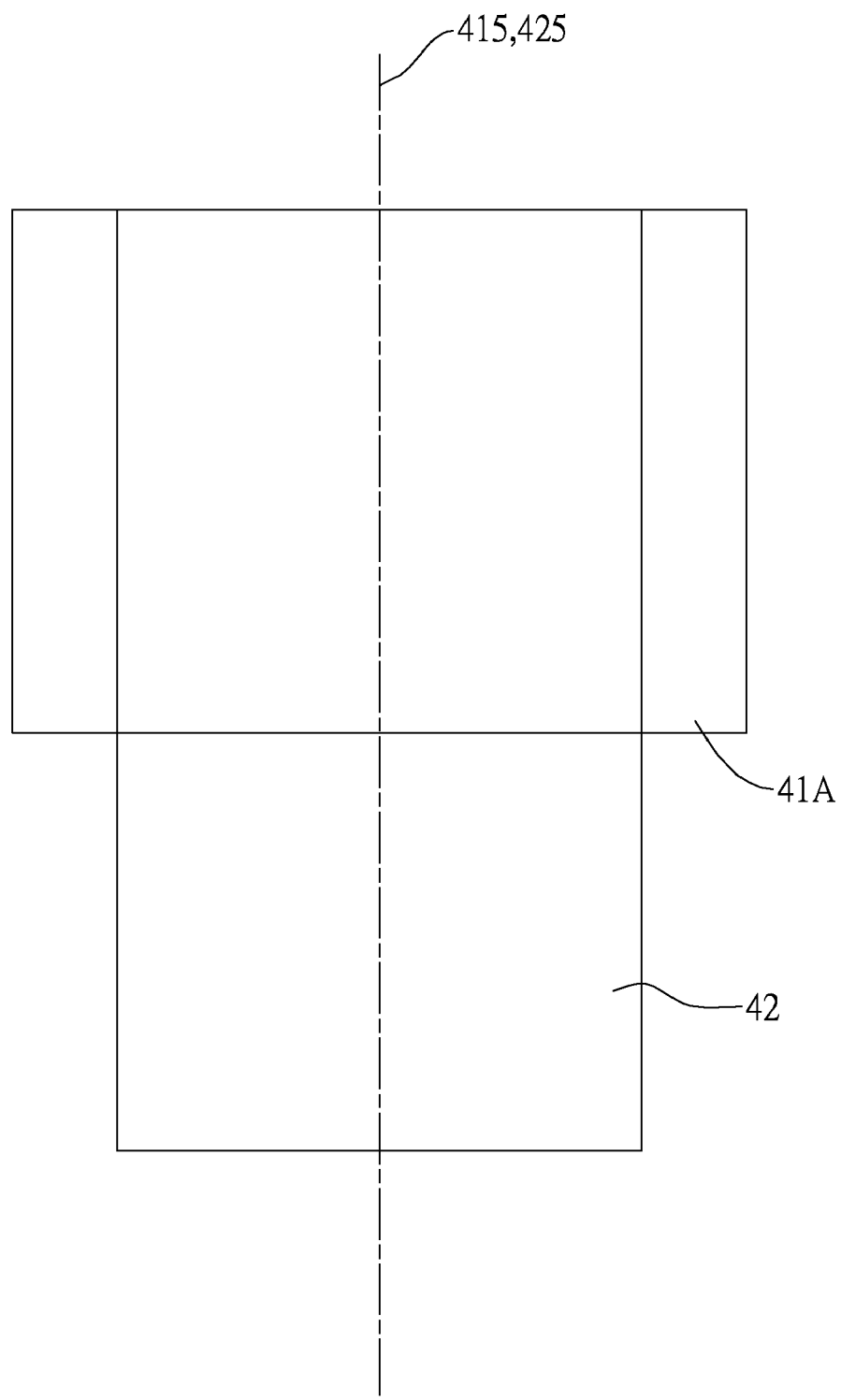

With further reference to FIGS. 8B and 9B, determine an open position that the cover (41, 41A) is perpendicular with the body (42) and the central lines of the cover (41, 41A) and the body (42) align with each other.

Figure 8C:
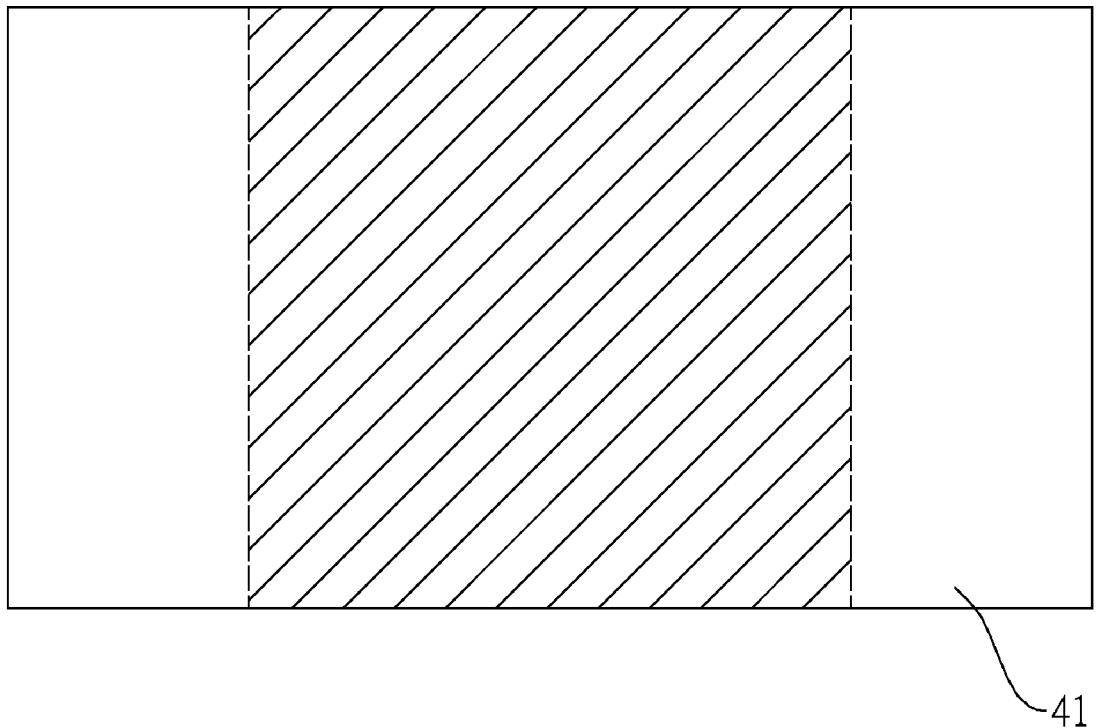
Figure 9C:
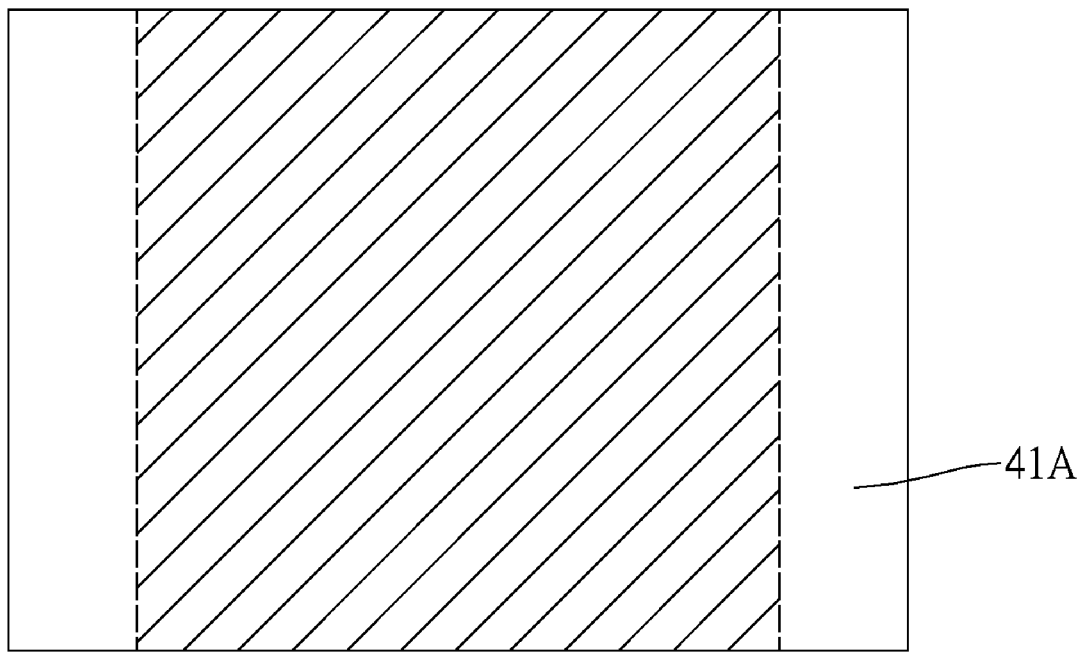

With further reference to FIGS. 8C and 9C, determine a first overlapping area on the cover (41, 41A) that the cover (41, 41A) overlaps the body (42) at the open position.

Figure 8D:
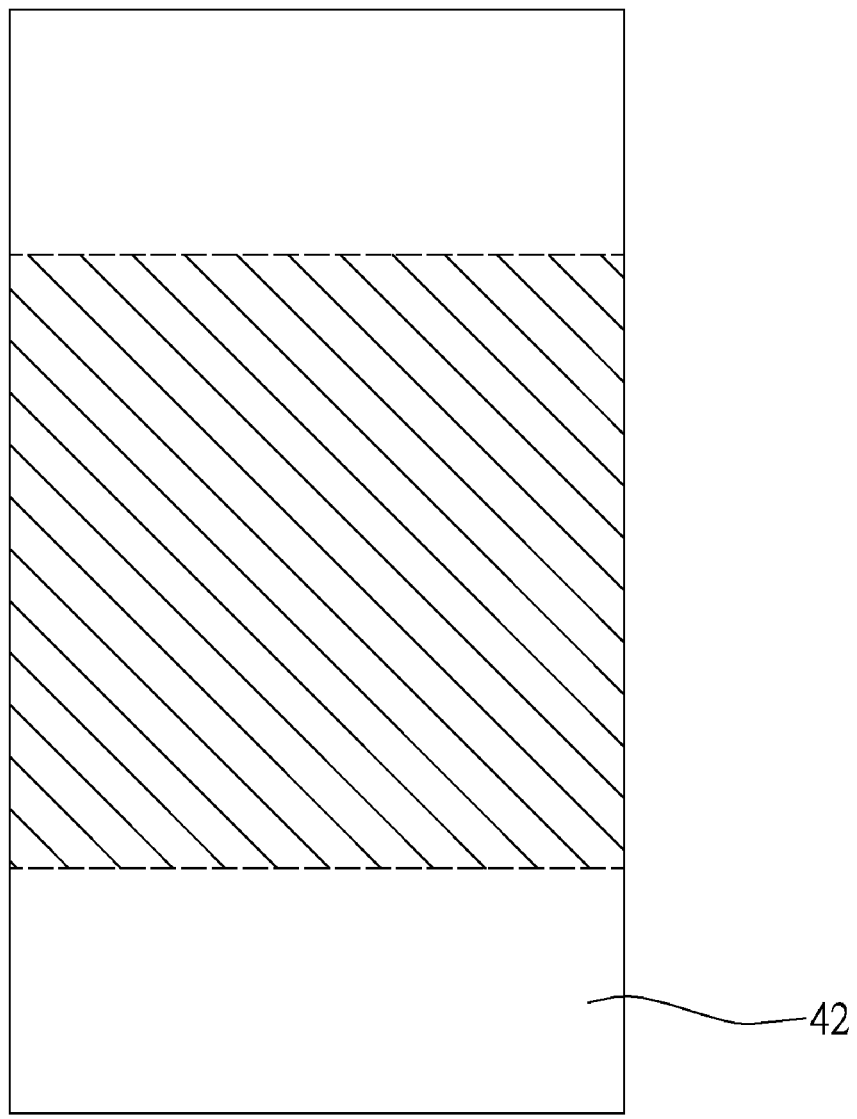
Figure 9D:
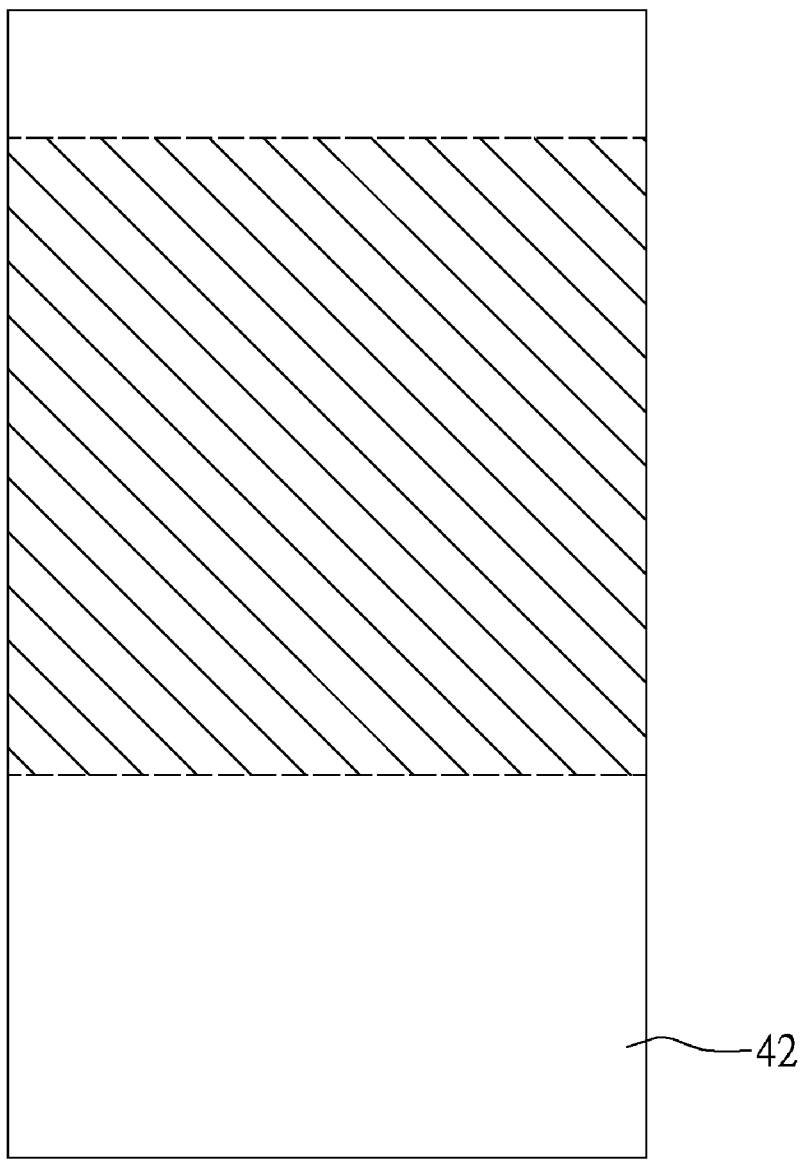

With further reference to FIGS. 8D and 9D, determine a second overlapping area on the body (42) that the body (42) overlaps the first overlapping area at the closed position.

Figure 8E:
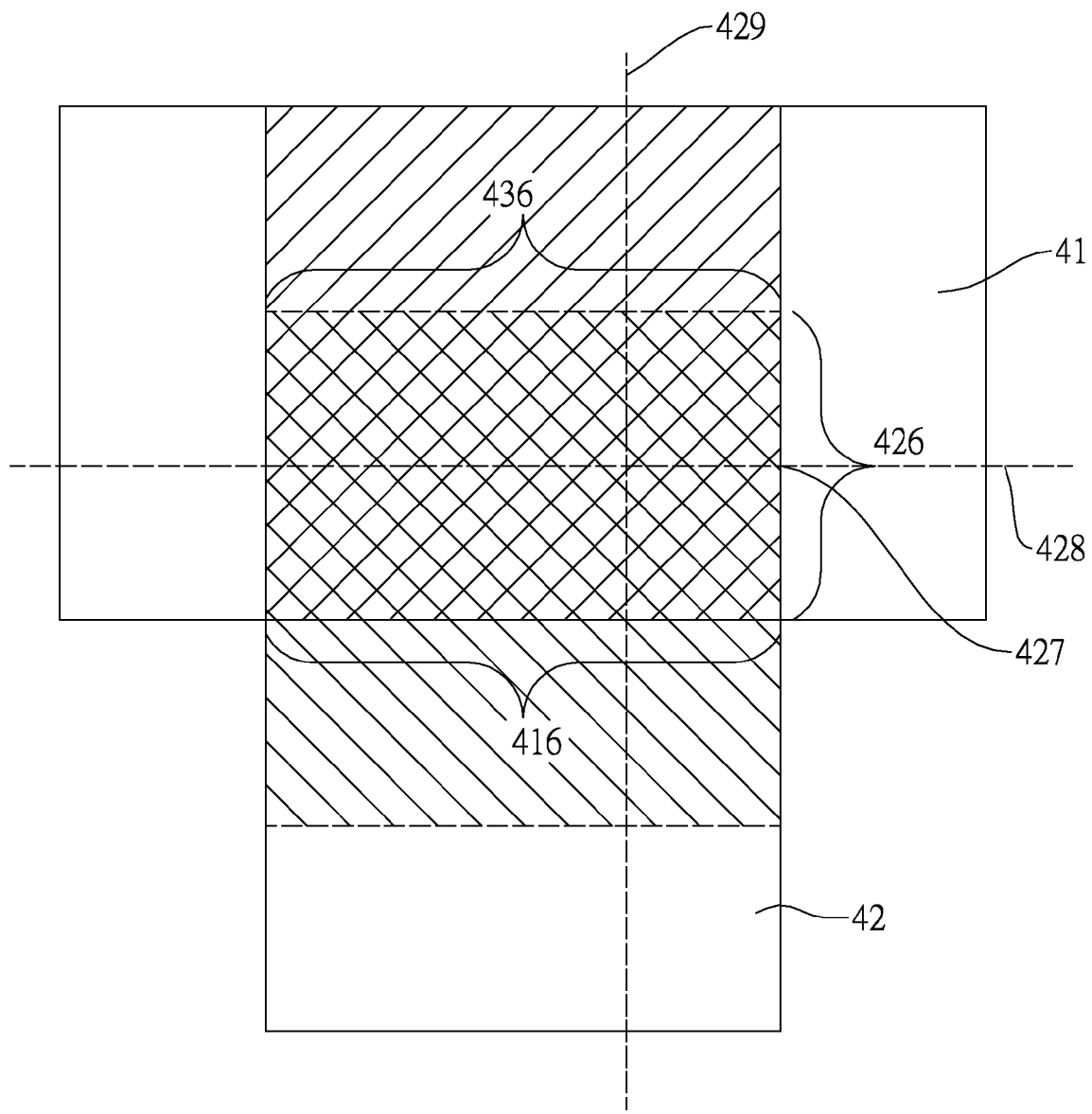
Figure 9E:
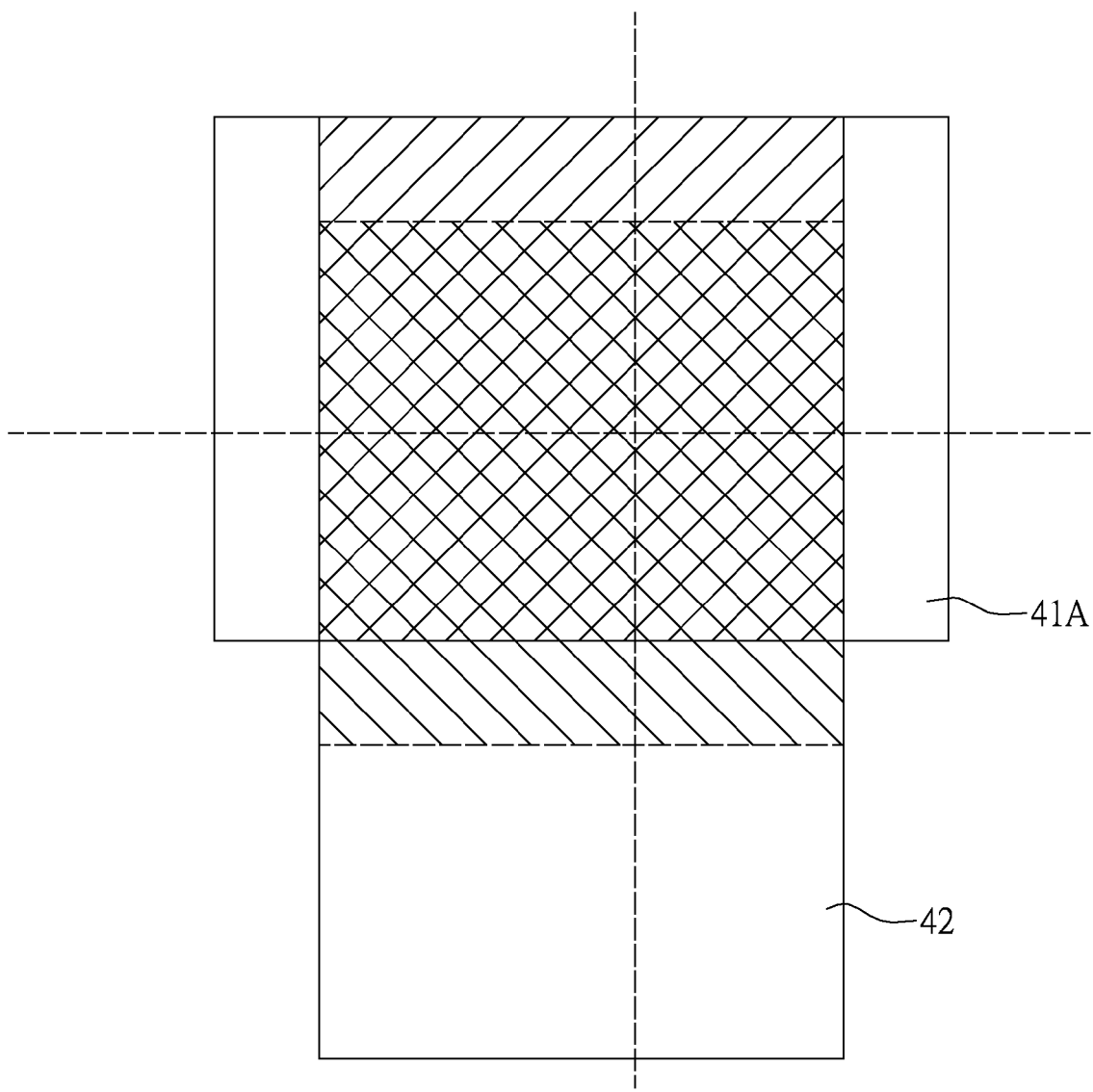

With further reference to FIGS. 8E and 9E, determine a third overlapping area that the first and second overlapping areas overlap with each other at the open position.

Determine three sidelines of the third overlapping area as operative sidelines, wherein a first operative sideline (416) aligns with one boundary of the cover (41, 41A), a second operative sideline (426) aligns with one boundary of the body (42) and a third operative sideline (436) is parallel to the first operative sideline.

Obtain a center (427) of the second operative sideline (426) and a half-length of the second operative sideline (426) defined as an indicated length.

Define a first centerline (428) that passes through the center (427) of the second operative sideline (426) and is parallel to the first and third operative sidelines (416, 436).

Define a second centerline (429) that passes through the first and third operative sidelines (416,436) and is parallel to the second operative sideline (426), wherein a distance between the second centerline (429) and the second operative sideline (426) is equal to the indicated length.

Obtain an intersection point of the first and second centerlines (428,429) as a pivot of the rotary hinge (1).

Figure 10:
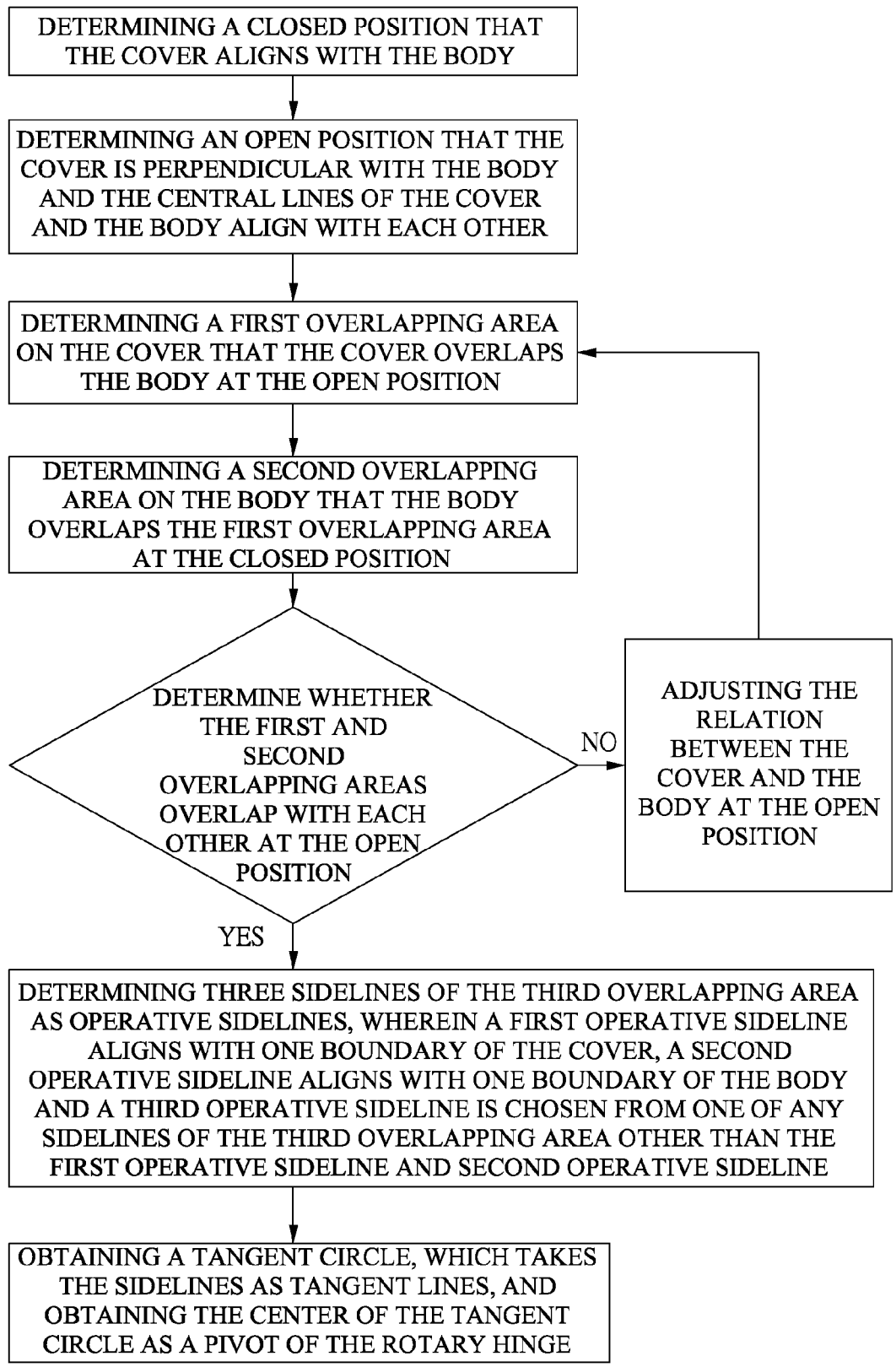
FIG. 10 is a block diagram of another embodiment of a method of determining a pivot for a rotary hinge of a portable electronic device in accordance with the present invention.

In another preferred embodiment, the method of finding a pivot for the rotary hinge (1) in accordance with the present invention comprises the following steps as shown in FIG. 10. The method shown in FIG. 10 is similar to the method shown in FIG. 7 but has different steps after determining a second overlapping area.

After the second overlapping area is determined, determine whether the first and second overlapping areas overlap with each other at the open position to form a third overlapping area or not.

If the third overlapping area does not exist, the relation between the cover and the body should be adjusted at the open position. Than the first overlapping area and the second overlapping area should be determined again until the third overlapping area exists.

If the third overlapping area exists, determine three sidelines of the third overlapping area as operative sidelines, wherein a first operative sideline (416) aligns with one boundary of the cover (41, 41A), a second operative sideline (426) aligns with one boundary of the body (42) and a third operative sideline (436) is chosen from one of any sidelines of the third overlapping area other than the first operative sideline (416) and second operative sideline (426). Then obtain a tangent circle, which takes the sidelines (416, 426, 436) as tangent lines. The center of the tangent circle is a pivot of the rotary hinge (1).

Figure 11:
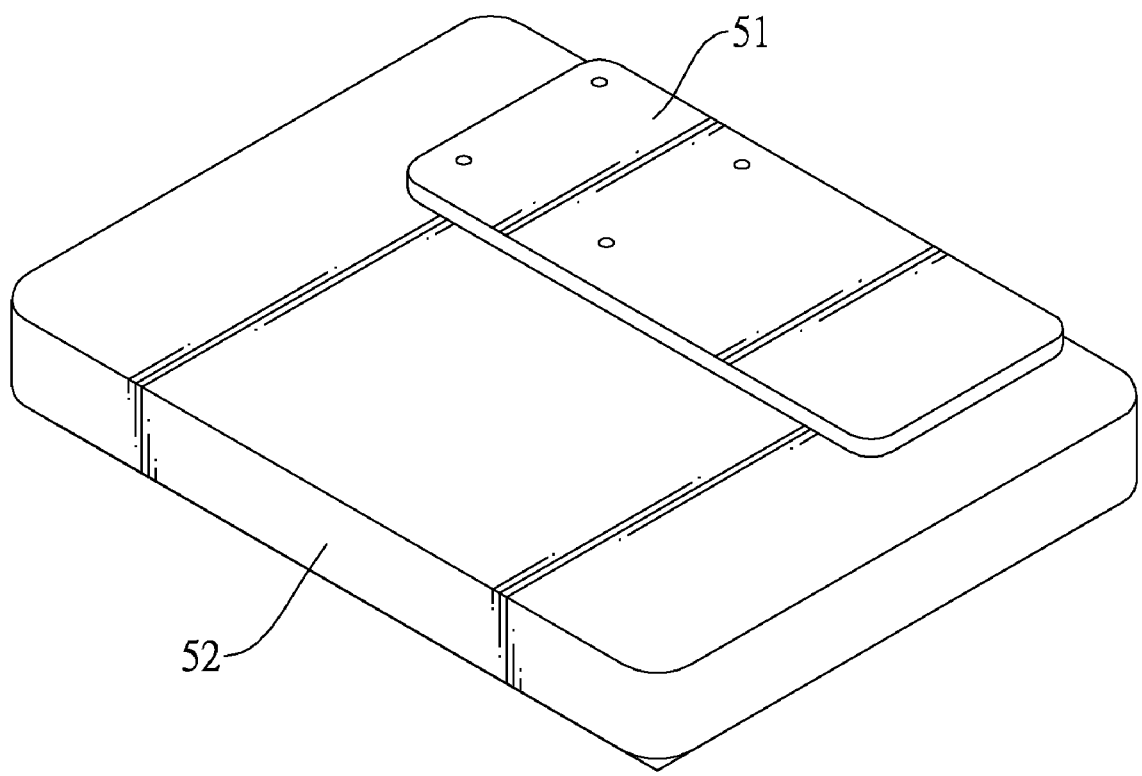
FIG. 11 is a perspective view of a portable electronic device in accordance with the present invention.
Figure 12:
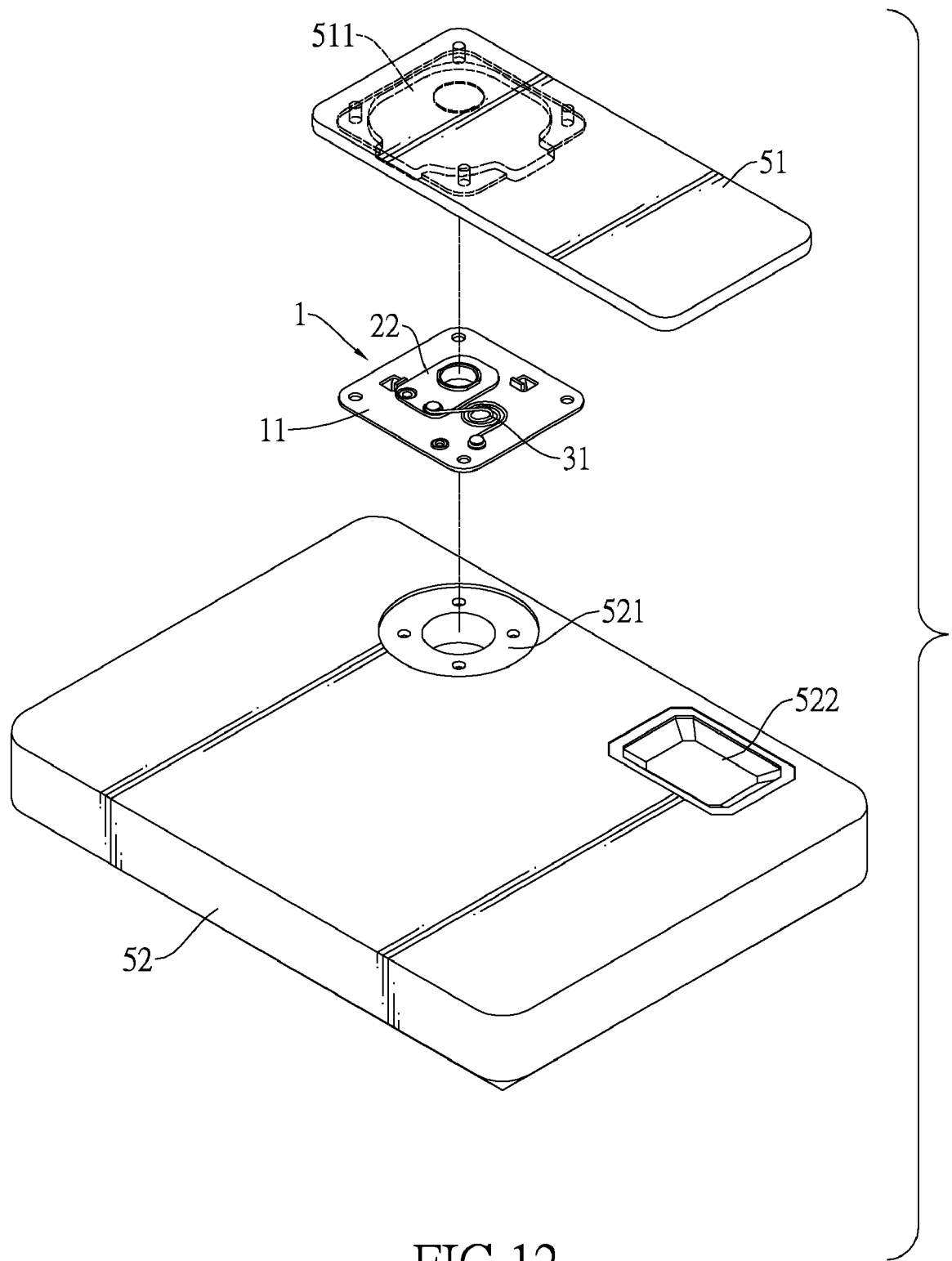
FIG. 12 is an exploded perspective view of the portable electronic device in FIG. 11.

With reference to FIGS. 11 and 12, another embodiment of a portable electronic device in accordance with the present invention comprises a body (52), a cover (51) and a rotary hinge (1). A bottom of the cover (51) is attached pivotally to a top of the body (52). The rotary hinge (1) is connected between the bottom of the cover (51) and the top of the body (52). The rotary hinge is attached to a pivoting end of the bottom of the cover (51). The body (52) has a lens hole (522) formed in the top of the body (52). A free end of the cover (51) selectively covers the lens hole (522). In a preferred embodiment, the receiving panel (11) is mounted securely in a first mounting recess (511) in the bottom of the cover (51). The additional panel (22) and the torsion spring (31) are located in the first mounting recess (511) in the bottom of the cover (51). The connecting panel (21) is mounted securely in a second mounting recess (521) in the top of the body (52).

Figure 13:
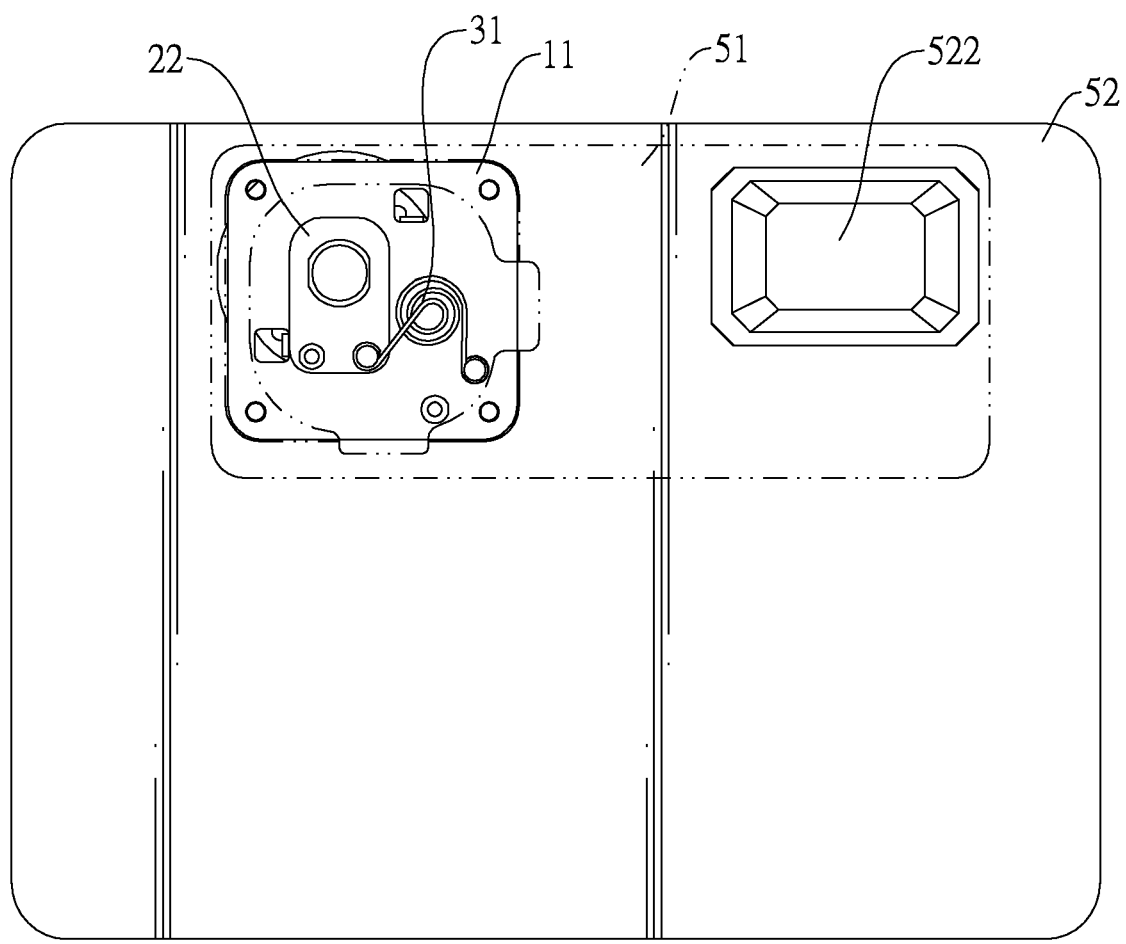
FIG. 13 is an operational top view of the portable electronic device in FIG. 11, shown closed.

With further reference to FIG. 13, the free end of the cover (51) covers the lens hole (522).

Figure 14:
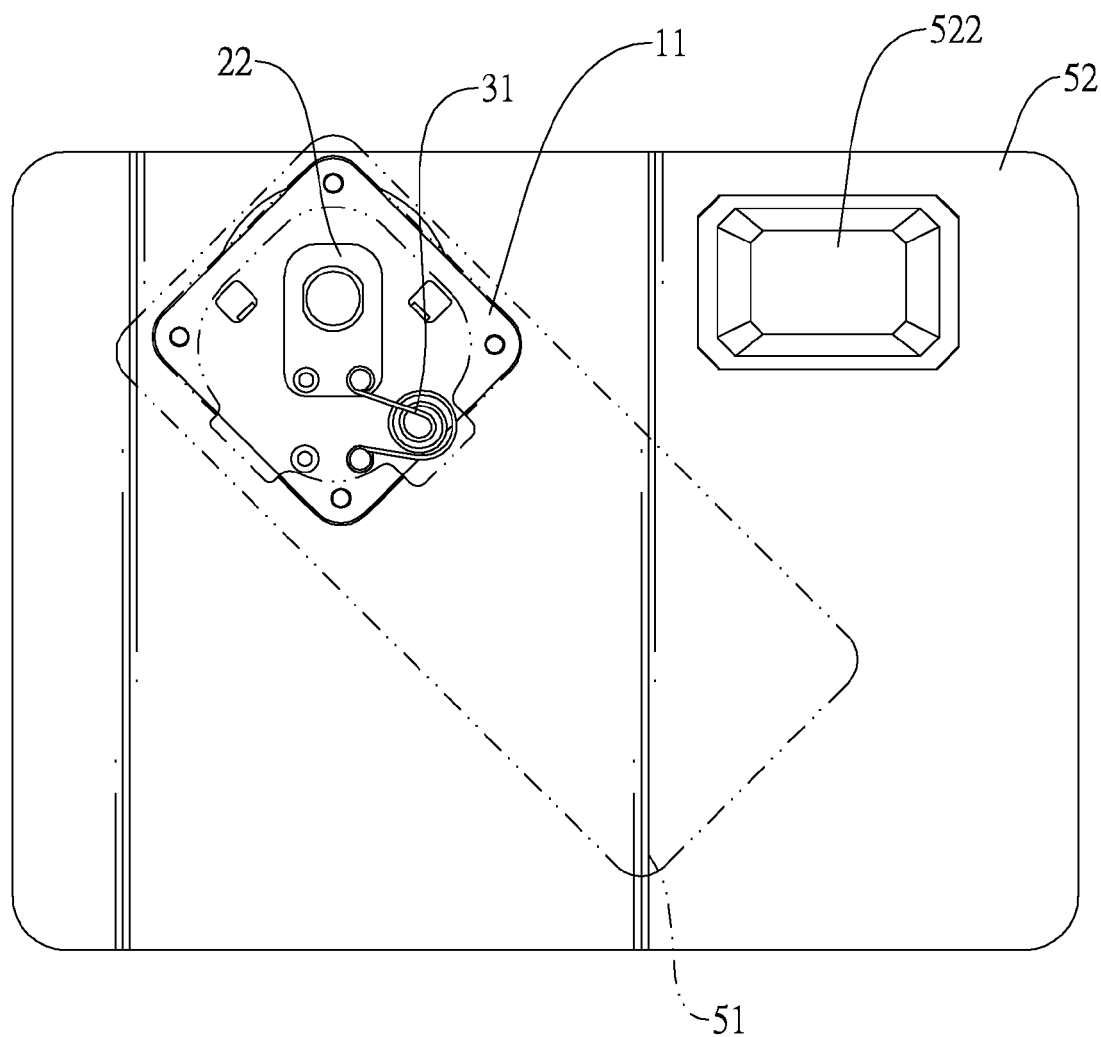
FIG. 14 is an operational top view of the portable electronic device in FIG. 11, shown partially opened.

With further reference to FIG. 14, the cover (51) is pivoted relative to the body (52). The receiving panel (11) is rotated relative to the connecting assembly (20) and the torsion spring (31) is compressed.

Figure 15:
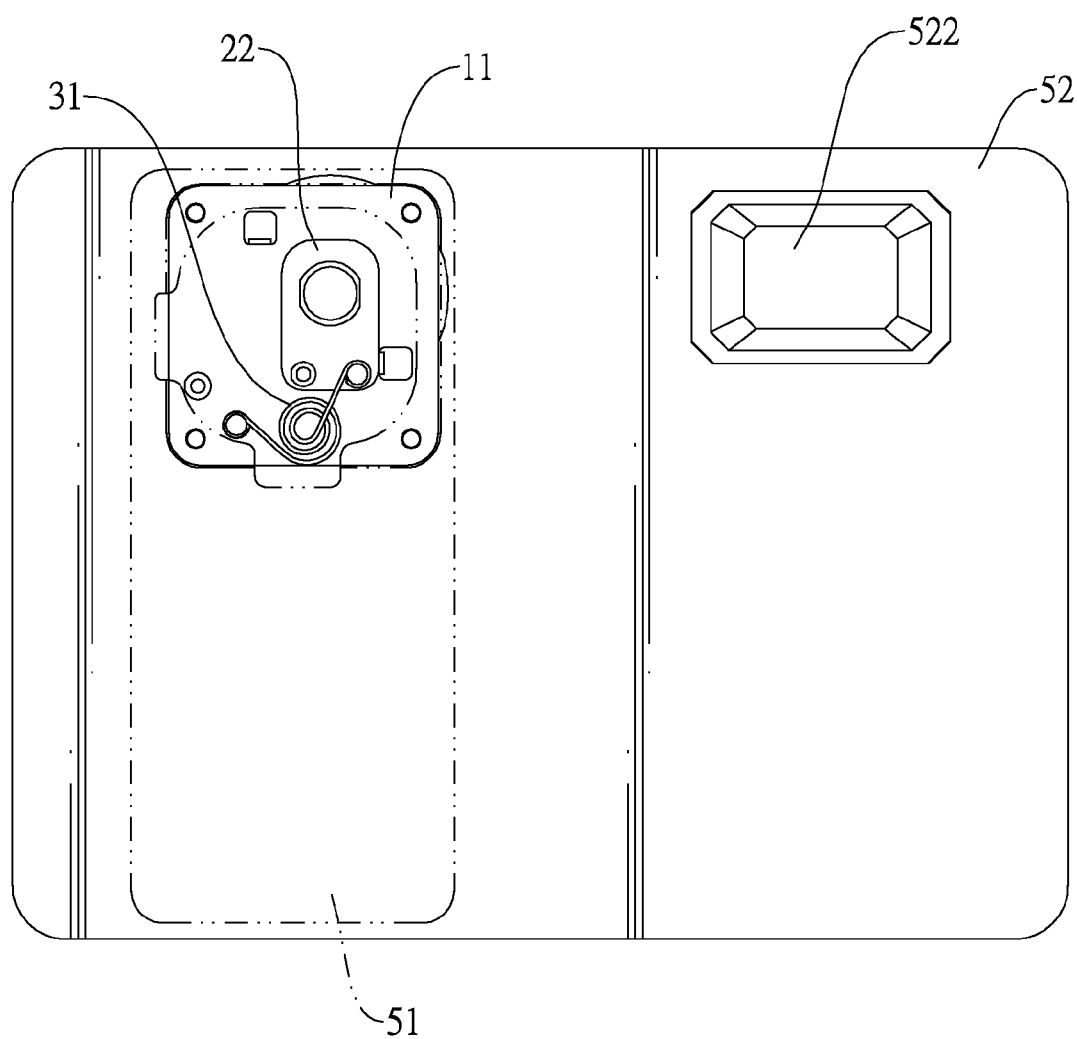
FIG. 15 is an operational top view of the portable electronic device in FIG. 10, shown fully opened.

With further reference to FIG. 15, when the cover (51) is pivoted to a certain distance, the cover (51) may be released and the torsion spring (31) pushes the cover (51) to keep pivoting until fully opened. Then the torsion spring (31) holds the cover (51) at a fully opened position. The lens hole (522) is revealed for use.

Therefore, changing the relative position of the pivot of the rotary hinge and the cover of the portable electronic device, the cover has different rotating stroke for different use.

The present invention has following advantages. The rotary hinge as described has only one pivot with the cover and the body of the portable electronic device so that part of the body is exposed to allow the input unit being used when the cover is pivoted to open. When the cover is opened relative to the body, the rotary hinge still covers between the body and the cover to prevent damaging and foreign matters. Furthermore, With the aforementioned method, the portable electronic device as described is easily assembled to have the central line of the cover aligns with the central line of the body when the cover is pivoted 90 degrees. Regardless of the relative sizes of the cover and the body, the aforementioned method is applied to the electronic portable devices with the rotary hinge as described.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A rotary hinge comprising:
a receiving assembly having a receiving panel having a first pivoting hole being circular and formed therethrough;
a connecting assembly connected pivotally to the receiving assembly and comprising
a connecting panel attached respectively to the receiving panel and having a second pivoting hole being non-circular, formed therethrough and aligning with the first pivoting hole;
an additional panel having a third pivoting hole being non-circular, formed therethrough and aligning with the first and second pivoting holes, the additional panel and the connecting panel being attached respectively to two opposite sides of the receiving panel; and
a pintle being non-circular in cross section and keyed with the second and third pivoting holes, mounted securely through the connecting panel, mounted rotatably through the receiving panel and mounted securely through the additional panel; and
a retaining assembly connected to the receiving assembly and the connecting assembly and providing resilient force to selectively hold the receiving assembly and the connecting assembly at two relative positions.

2. The rotary hinge as claimed in claim 1, wherein the retaining assembly comprises at least one torsion spring, and each one of the at least one torsion spring has one end connected to the receiving assembly and the other end connected to the additional panel.

3. A portable electronic device with a rotary hinge as claimed in claim 1 comprising:
a cover having a bottom;
a body connected pivotally with the cover and having a top;
the rotary hinge connected pivotally between the bottom of the cover and the top of the body;
the receiving assembly of the rotary hinge is connected to the cover; and
the connecting assembly of the rotary hinge is connected to the body.

4. The portable electronic device as claimed in claim 3, wherein the rotary hinge is attached to a middle portion of the bottom of the cover.

5. The portable electronic device as claimed in claim 4, wherein
a first mounting recess is formed in a bottom of the cover;
a second mounting recess is formed in a top of the body;
the receiving panel of the receiving assembly is mounted securely in the first mounting recess;
the connecting panel of the connecting assembly is mounted securely in the second mounting recess; and
the additional panel of the connecting assembly is mounted in the first mounting recess.

6. The portable electronic device as claimed in claim 3, wherein the rotary hinge is attached to a pivoting end of the bottom of the cover.

7. The portable electronic device as claimed in claim 6, wherein
a first mounting recess is formed in a bottom of the cover;
a second mounting recess is formed in a top of the body;
the receiving panel of the receiving assembly is mounted securely in the first mounting recess;
the connecting panel of the connecting assembly is mounted securely in the second mounting recess; and
the additional panel of the connecting assembly is mounted in the first mounting recess.

8. The portable electronic device as claimed in claim 3, wherein
a first mounting recess is formed in a bottom of the cover;
a second mounting recess is formed in a top of the body;
the receiving panel of the receiving assembly is mounted securely in the first mounting recess;
the connecting panel of the connecting assembly is mounted securely in the second mounting recess; and
the additional panel of the connecting assembly is mounted in the first mounting recess.

9. The portable electronic device as claimed in claim 8, wherein the retaining assembly comprises at least one torsion spring, and each one of the at least one torsion spring has one end connected to the receiving assembly and the other end connected to the additional panel.

* * * * *